US005812829A

United States Patent [19]

Ito

[11] Patent Number: 5,812,829

[45] Date of Patent: Sep. 22, 1998

[54] IMAGE DISPLAY CONTROL SYSTEM AND MEMORY CONTROL CAPABLE OF FREELY FORMING DISPLAY IMAGES IN VARIOUS DESIRED DISPLAY MODES

[75] Inventor: Shuhei Ito, Hamamatsu, Japan

[73] Assignee: Yamaha Corporation, Hamamatsu, Japan

[21] Appl. No.: 542,201

[22] Filed: Oct. 12, 1995

[30] Foreign Application Priority Data

Oct. 13, 1994 [JP] Japan .................................... 6-274429
Oct. 13, 1994 [JP] Japan .................................... 6-274430

[51] Int. Cl.[6] ...................................................... G11C 7/00

[52] U.S. Cl. ............................................................ 395/516

[58] Field of Search ............................ 345/200, 115–116, 345/189–191, 203; 395/507, 509–510, 515–516, 494

[56] References Cited

U.S. PATENT DOCUMENTS

| | | |
|---|---|---|
| 4,953,101 | 8/1990 | Kelleher et al. . |
| 5,355,443 | 10/1994 | Kim et al. . |
| 5,390,149 | 2/1995 | Vogley et al. . |
| 5,473,342 | 12/1995 | Tse et al. . |
| 5,483,257 | 1/1996 | Otake et al. . |
| 5,499,039 | 3/1996 | Mistrot . |
| 5,530,458 | 6/1996 | Wakasu . |
| 5,560,000 | 9/1996 | Vogley . |
| 5,585,824 | 12/1996 | Sherburne . |
| 5,587,954 | 12/1996 | Vogley et al. . |
| 5,598,526 | 1/1997 | Daniel et al. . |

*Primary Examiner*—Mark R. Powell
*Attorney, Agent, or Firm*—Pillsbury Madison & Sutro LLP

[57] ABSTRACT

An image display control system stores display data in a memory. A display coordinate generator generates coordinates on a display space, based on a count for use in position control of display scan. An address generator generates addresses of the display data stored in the memory, based on the coordinates generated by the display coordinate generator. A memory interface device accesses the memory according to the addresses generated by the address generator. Mode-setting registers set a display mode for each memory access slot required for accessing one address of the memory. A slot-selecting device selects a set value from set values stored in the mode-setting registers to indicate the display mode. A decoder decodes the set value selected by the slot-selecting device to generate a control signal corresponding to the display mode to be supplied to the address generator and the memory interface device. A delay device delays the control signal generated by the decoder by a time period required by the address generator for generating each of the addresses generated by the address generator.

4 Claims, 8 Drawing Sheets

FIG.5

| ACCESS SLOT CONTROL CODE | DETAILS OF ACCESS |
|---|---|
| 0 | PATTERN NAME OF 1ST SCREEN |
| 1 | PATTERN NAME OF 2ND SCREEN |
| 2 | PATTERN NAME OF 3RD SCREEN |
| 3 | PATTERN NAME OF 4TH SCREEN |
| 4 | CHARACTER DATA OF 1ST SCREEN |
| 5 | CHARACTER DATA OF 2ND SCREEN |
| 6 | CHARACTER DATA OF 3RD SCREEN |
| 7 | CHARACTER DATA OF 4TH SCREEN |
| 8 | ACCESS BY CPU |
| F | NO ACCESS |

FIG.6

| | T0 | T1 | T2 | T3 | T4 | T5 | T6 | T7 |
|---|---|---|---|---|---|---|---|---|
| BANK0 | 0 | F | F | F | 4 | 4 | 4 | 4 |
| BANK1 | 1 | 5 | 5 | F | 2 | 6 | 3 | 7 |

*FIG.8*

| ACCESS SLOT CONTROL CODE | DETAILS OF ACCESS |
|---|---|
| 0 | PATTERN NAME OF 1ST SCREEN |
| 1 | PATTERN NAME OF 2ND SCREEN |
| 2 | PATTERN NAME OF 3RD SCREEN |
| 3 | CHARACTER DATA OF 1ST SCREEN |
| 4 | CHARACTER DATA OF 2ND SCREEN |
| 5 | CHARACTER DATA OF 3RD SCREEN |
| 6 | NO ACCESS |
| 7 | NO ACCESS |

IMAGE DISPLAY CONTROL SYSTEM AND MEMORY CONTROL CAPABLE OF FREELY FORMING DISPLAY IMAGES IN VARIOUS DESIRED DISPLAY MODES

BACKGROUND OF THE INVENTION

1. Field of the Invention

This invention relates to an image display control system which employs a memory for storing display data, and particularly to an image display control system which enables free formation of the display image in various desired display modes, as well as to a memory control system which is suitable for use in an image display control system of this kind.

2. Prior Art

An image display system in general is required to read image data from a memory such as a video memory or a frame memory as desired during a display period. An image display system used for video games or the like is frequently required to rewrite data in the memory concurrently with reading-out of data therefrom. A dynamic RAM (DRAM) has been conventionally used as such an image memory.

However, an ordinary DRAM requires an access time longer than a time period required for displaying data of one dot. Therefore, to achieve high-speed memory access during a display period, there have been employed (1) a method which comprises reading out image data of several dots from the memory at one time, and converting the read-out data into RGB data according to scanning for display (display scan), to thereby spare the remaining time for access to the memory for rewriting data therein, or (2) a method which uses a dual port DRAM to simultaneously carry out reading-out of data and rewriting of data, etc.

These methods can barely read out nearly data of 64 bits within a display period of eight dots. However, the reading-out rate given by these values can provide e.g. an amount of display data for only one screen in the case of simultaneous display of 256 color data (requiring data of eight bits per dot), or an amount of display data for only two screens in the case of simultaneous display of 16 color data (requiring data of four bits per dot). Under the circumstances, possible display modes (e.g. a mode of simultaneous display of a 256 color image on one screen, a mode of simultaneous display of 16 color images for two screens in a overlaid fashion, etc.) are limited in number. That is, the conventional image display system employs a control circuit which has fixed hardware designed according to a particular mode of display intended to be used, which determines the minimum unit time (hereinafter referred to as "memory access slot") required for access to one address of the memory.

On the other hand, in an image display system used e.g. for video games or the like, there are strong demands for a function of overlaying a large number of display images and a function of simultaneously displaying images with a larger number of colors. In overlaying display images one upon another, image data stored in the memory, which correspond to a plurality of screens, are processed first, and then an image to be displayed is determined for each dot according to priorities given to the screens. Therefore, an image display system for video games or the like is strongly demanded, which has capability of access to the image memory for reading out data of more bits at one time.

As a DRAM satisfying such a demand, a synchronous DRAM (hereinafter referred to as "SDRAM") is noteworthy, which realizes high-speed access to data. The SDRAM has two memory areas (a bank 0 and a bank 1) for use in divided bank mode, and the bank 0 and the bank 1 are alternately accessed under control of a clock, whereby a readout address is input to the bank 1 while data is read out from the bank 0. The use of the SDRAM enables, for example, data of 512 bits to be accessed within a time period required to display 8 dots of data in the case of 16 bit-wide data.

If the high-speed access SDRAM is used as an image memory, for example, data for two screens can be accessed, even if the screen requires data of 24 bits per dot, which enables display of a full color image. In the case of 4 bits/dot display (16-color display mode) used in text display or the like, data for 16 screens can be accessed. Further, as to the number of display colors, there can be employed display modes of 24 bits/dot display, 16 bits/dot display, 8 bits/dot display, and 4 bits/dot display. Therefore, there are lots of possible choices of the mode, including an overlay display mode in which several of the above display modes are used in combination to display overlaid images, and a character mode and a bit map mode depending on selection of display data stored in the memory.

However, in realizing such a large number of display modes, the use of the conventional control circuit with fixed hardware to control the memory access slot in dependence on selected setting of the display mode provides the following problems:

First, the control circuit has to be designed so as to suit a display mode which is most frequently used.

Secondly, if the character mode is selected, which usually involves changing a manner of generating pattern name addresses and character addresses in dependence on the number of display colors for each screen, or selecting different attribute data for respective screens, a plurality of control circuits have to be employed for a pattern name address generator and a character address generator, respectively, which results in an increased overall circuit size.

Further, it is easy to control the mode by setting the SDRAM to the divided bank mode during a display period and to a random access mode during a non-display period. However, this manner of mode control cannot meet a request from the CPU for rewriting the display image during a display period, which makes it impossible to carry out high-speed processing as the whole system.

SUMMARY OF THE INVENTION

It is a first object of the invention to provide an image display control system which is capable of freely forming the display image as desired by the use of a simple control circuit, by changing the manner of control of access to an image memory thereof according to selection of the display mode.

It is a second object of the invention to provide a memory control system which permits interrupt for operation in random access mode during reading-out of data in divided bank mode.

To attain the first object, according to a first aspect of the invention, there is provided an image display control system comprising:

a memory that stores display data;

a display coordinate generator that generates coordinates on a display space, based on a count for use in position control of display scan;

an address generator that generates addresses of the display data stored in the memory, based on the coordinates generated by the display coordinate generator;

a memory interface device that accesses the memory according to the addresses generated by the address generator;

mode-setting registers that set a display mode for each memory access slot which is the minimum unit time required for accessing one address of the memory;

a slot-selecting device that selects a set value from set values stored in the mode-setting registers to indicate the display mode;

a decoder that decodes the set value selected by the slot-selecting device to generate a control signal corresponding to the set display mode to be supplied to the address generator and the memory interface device; and a delay device that delays the control signal generated by the decoder by a time period required by the address generator for generating each of the addresses generated by the address generator.

It is preferred that the memory has a table in which character data are stored, and a table indicative of a relationship between positions on the display space and the character data, in which pattern name data items peculiar to respective items of the character data are stored, and that the address generator has a character address generator that generates addresses of the character data stored in the memory, and a pattern name address generator that generates addresses of the patter name data stored in the memory, and that the delay device has delay circuits that delays the control signal generated by the decoder by respective required time periods to supply the control signal thus delayed to the character address generator, the pattern name address generator, and the memory interface device.

According to the image display control system of the first aspect of the invention, the memory access control is not unchangeable irrespective of the display mode, but the mode-setting registers can set the display mode to a desired mode for each memory access slot. More specifically, it is possible to set, for each memory access slot, the display mode as desired, to a mode for executing access to a pattern name, or a mode for executing access to character data, or a mode for executing access to bit map data, further a mode for executing random access from the CPU, to thereby enable free formation of the display image.

Further, when the character mode is selected, different address generators need not be employed to change the manner of generating pattern name addresses or character addresses depending on the number of display colors for each screen, or to select different attribute data (offset values, data for controlling processing for imparting different effects according to respective characters, etc.) for respective screens, thereby simplifying the circuit for generating addresses.

To attain the second object of the invention, according to a second aspect of the invention, there is provided a memory control system comprising:

a dynamic RAM that permits changeover between a divided bank mode in which an interior of the dynamic RAM is divided into at least two banks which are precharged separately for being addressed alternately in a continuous manner, and a random access mode;

a mode-setting device that periodically sets a data readout mode in the divided bank mode of the dynamic RAM for each predetermined number of access slots;

an address generator that generates addresses for accessing the dynamic RAM according to the data readout mode set by the mode-setting device; and an interrupt control device that monitors output from the mode-setting device, and delivers a timing signal for changing a mode of access to the dynamic RAM from the divided bank mode to the random access mode when a contiguous occurrence of a predetermined number of access slots during which neither of the two banks is accessed is detected.

Preferably, the mode-setting device includes:

registers that each set an access mode for each access slot which is the minimum time unit required for accessing one address of the dynamic RAM;

a slot selector that selects a value indicative of the access mode which is set in each of the registers; and a decoder that decodes the value selected by the slot selector to generate a control signal to be supplied to the address generator.

According to the memory control system of the second aspect of the invention, the access mode of the SDRAM in divided bank mode can be set by the mode-setting device. Therefore, it is possible to set, for each memory access slot, the display mode as desired, to a mode for executing access to a pattern name, or a mode for executing access to character data, or a mode for executing access to bit map data, further a mode for executing random access from the CPU, to thereby enable free formation of the display image.

Further, the output from the mode-setting device is monitored to detect a contiguous occurrence of a predetermined number of access slots during which neither of the two banks is accessed, whereby it is possible to deliver a timing signal for changing a mode of access to the dynamic RAM from the divided bank mode to the random access mode. Therefore, high-speed performance of the whole system can be realized through efficient utilization of the access slots.

The above and other objects, features, and advantages of the invention will become more apparent from the following detailed description taken in conjunction with the accompanying drawings.

BRIEF DESCRIPTION OF THE DRAWINGS

FIG. 5 shows an example of codes set in a register of the first embodiment;

FIG. 6 is a diagram which is useful in explaining how data in the SDRAM are accessed according to the first embodiment;

FIG. 8 shows an example of codes set in a register of the second embodiment.

DETAILED DESCRIPTION

The invention will now be described in detail with reference to the drawings showing embodiments thereof.

Figure 1:
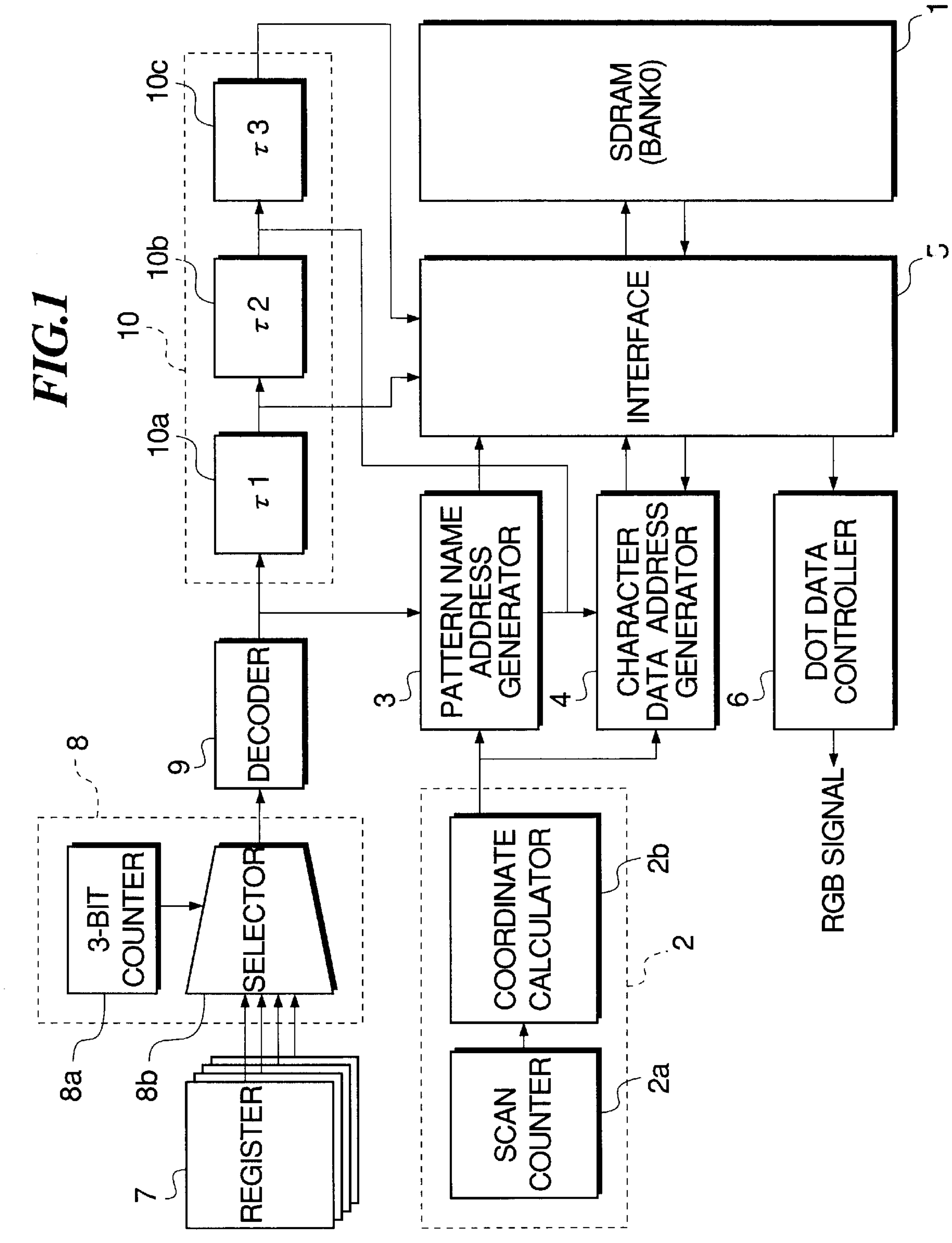
FIG. 1 is a schematic block diagram showing the arrangement of an image display control system according to a first embodiment of the invention.

Referring first to FIG. 1, there is shown the arrangement of an image display control system according to a first embodiment of the invention. The image display control system employs as an image memory an SDRAM 1 for storing display data. The SDRAM has its interior divided into two banks 0 and 1 for use in divided bank mode. In FIG. 1, the SDRAM is represented by the bank 0 alone, and the image display control system is shown to include blocks constituting a memory control circuit for controlling access to the bank 0. For the other bank 1 as well, a similar control circuit is provided, which includes devices for shared use by the two memory control circuits for the banks 0 and 1, by time-shared processing or the like.

Figure 2:
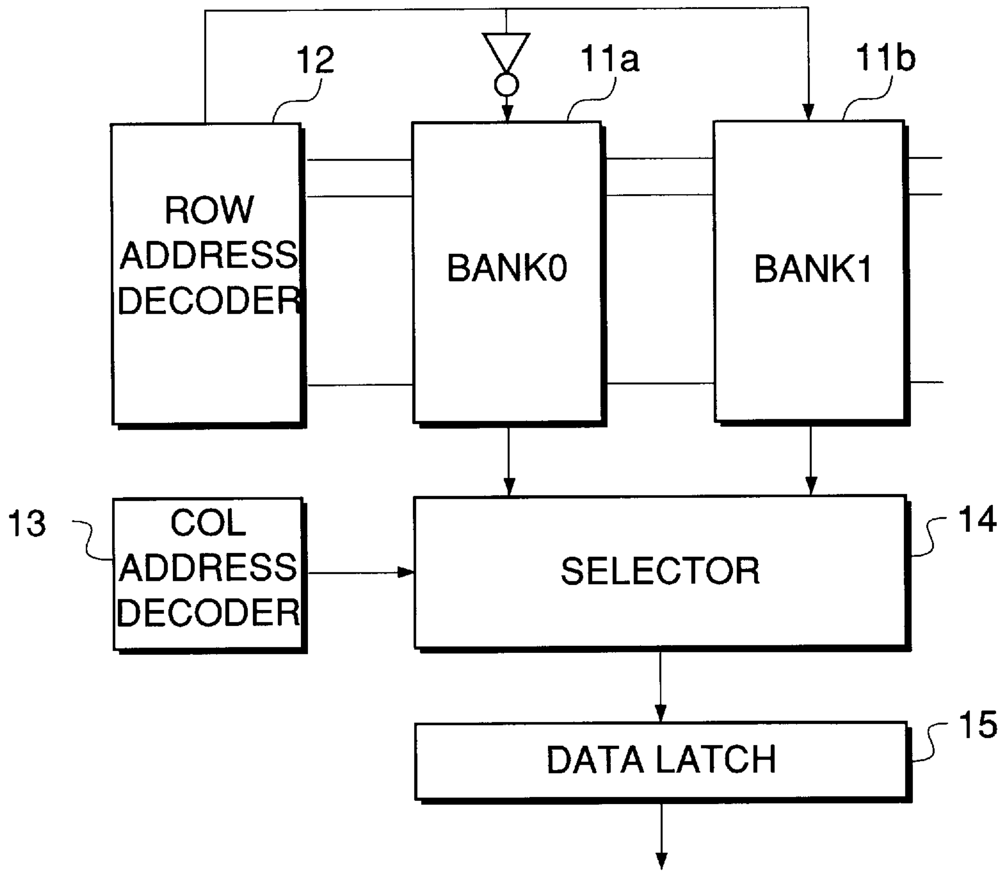
FIG. 2 is a block diagram showing the arrangement of an equivalent circuit of an SDRAM appearing in FIG. 1.

FIG. 2 shows the arrangement of an equivalent circuit of the SDRAM 1 for use in its divided bank mode. As shown in the figure, the SDRAM has an area 11*a* (bank 0) of memory addresses which each have its MSB (most significant bit) set to "0" and an area 11*b* (bank 1) of memory addresses which each have its MSB set "1". The banks 0, 1 can be alternately accessed by a row address decoder 12 and a column address decoder 13 so that the banks 0, 1 can be precharged separately. Data read out from the banks 0, 1 are selected by a selector 14, and the selected data are loaded into a data latch 15 and then delivered to an external display device, not shown.

Figure 3:
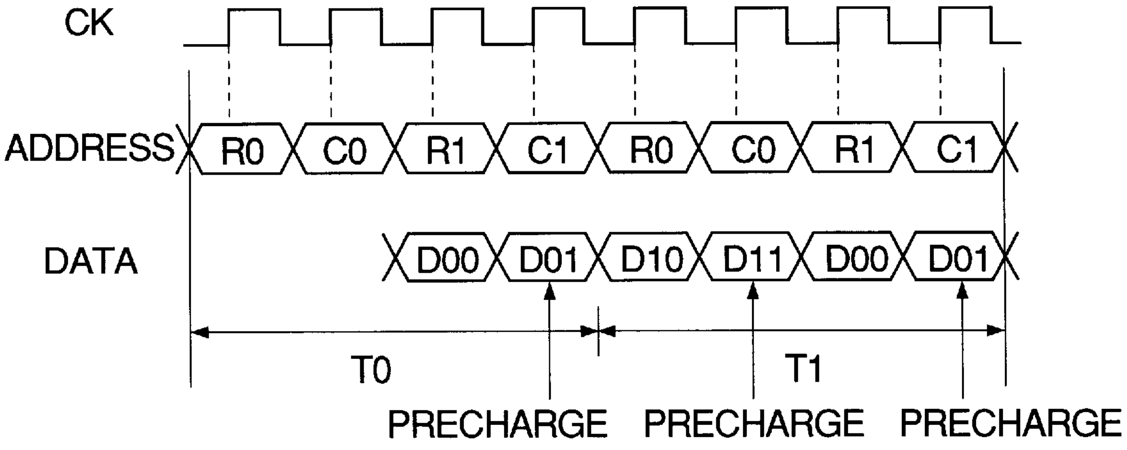
FIG. 3 is a timing chart showing timing of access to the SDRAM in FIG. 2.

FIG. 3 shows an example of timing of access to the SDRAM 1 for reading out data therefrom. A row address R0 and a column address C0 for the bank 0, and a row address R1 and a column address C1 for the bank 1 are alternately input according to a clock CK. Data D00, D01 are read from the bank 0 and delivered at timing of the clock CK, i.e. timing of inputting of the row address R1 and column address C1 to the bank 1. The data D01 is read from an address next to an address of the data D00, which means that data of two words can be output by one address inputting. If data of only one word is needed, the data D01 is unnecessary. Precharge of each bank is automatically executed at timing of outputting of the final data, i.e., the data D01, when data are to be output in two words. Outputting of data D10 from the bank 1 and precharge of the bank 1 are executed in the same manner. The data are 16 bits wide, and the unit time period for access to data is equal to a time period required for outputting one address (a row address and a column address) for a bank and reading out 16-bit data of two words according to the address. In other words, as shown in FIG. 3, time periods T0, T1, . . . , each corresponding to four periods of the clock CK, each represent a cycle of display, i.e. a time period (approximately 140 nS) required to display data of one dot (8 bits), which defines the memory access slot of the SDRAM 1.

To control access to the SDRAM 1 for display data, as shown in FIG. 1, there is provided a display coordinate generator 2 which is composed of a scan counter 2*a* for counting a horizontal position of display scan and a vertical position of the same, and a coordinate-calculator 2*b* for generating coordinates on a display space based on the count of the scan counter 2*a*. For example, when the display screen is formed of 40×20 cells (1 cell=8×8 dots), the display coordinate generator 2 sequentially generates cell coordinate values indicative of display positions (0,0), (1,0), . . . .

Figure 4A:
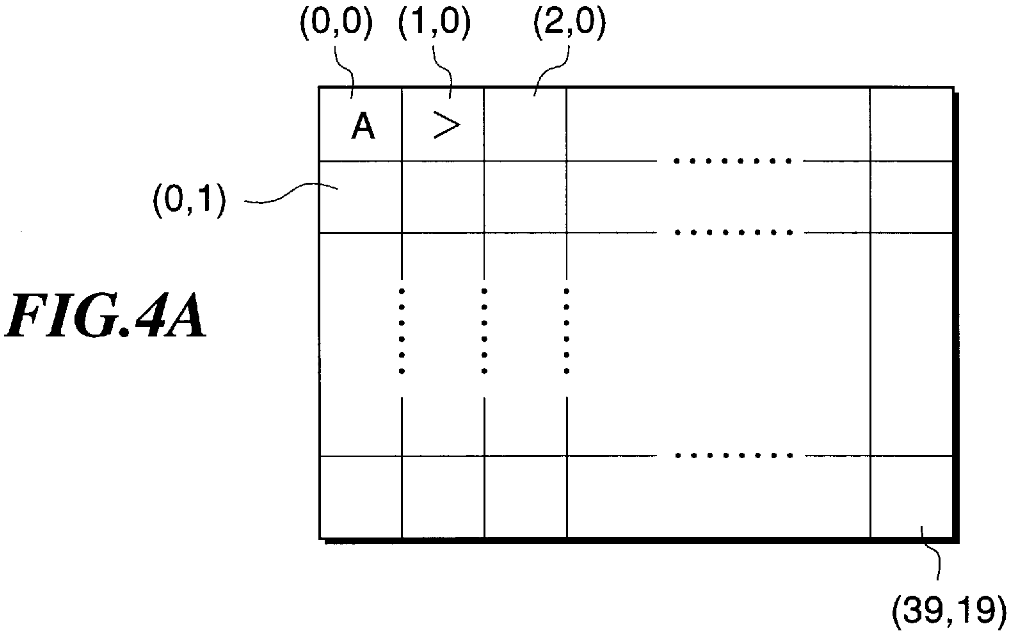
FIG. 4A is a diagram showing a display screen obtained by the first embodiment.
Figure 4B:
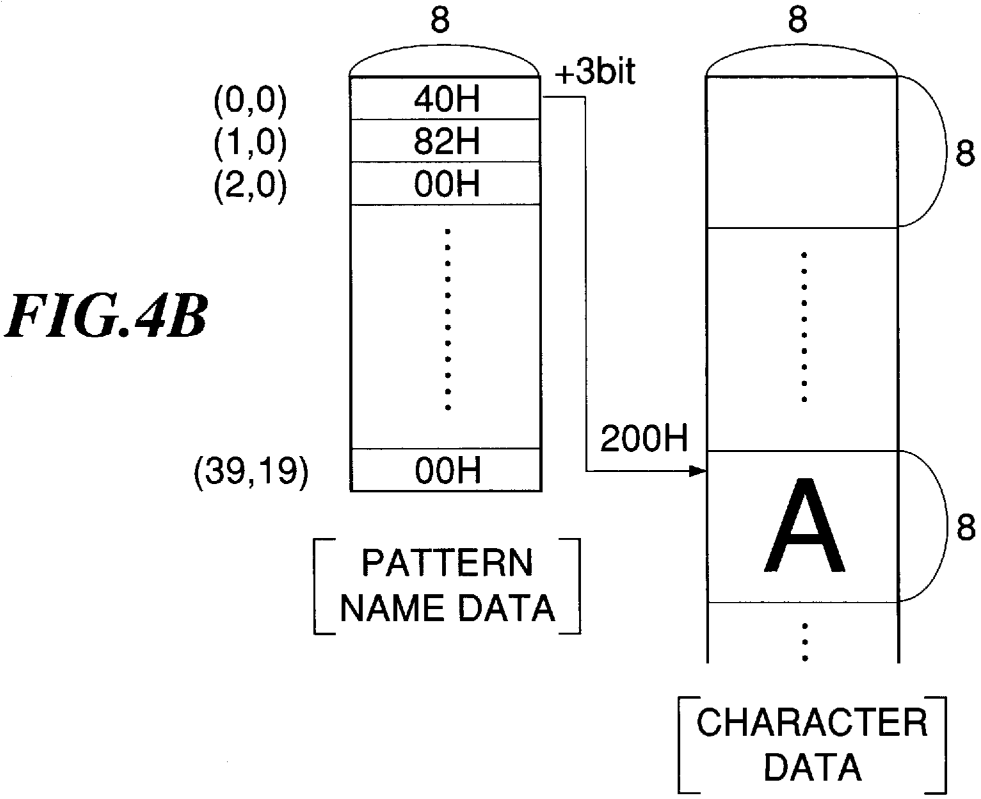
FIG. 4B shows contents of data corresponding to the FIG. 4A screen, which are stored in the SDRAM.

The SDRAM shown in FIG. 1 stores display data for the bit map mode in addition to display data for the character mode. FIGS. 4A and 4B show an example of a display screen and data therefor in the character mode. More specifically, as shown in FIG. 4B, the SDRAM 1 stores a table of character data items each formed of 8×8 bits, and a table of pattern name data items for use in selecting a character data item according to a display screen. As means for generating addresses of data stored in the SDRAM 1 based on the coordinates obtained by the display coordinate generator 2, there are provided a pattern name address generator 3 and a character data address generator 4.

For example, the display screen is divided into a number of small areas (cells) each corresponding to the minimum unit of character data of 8×8 dots or 16×16 dots, and pattern names peculiar to respective character data items are set cell by cell to set a character pattern to be displayed at each cell of the screen. The pattern names are often denoted by actual numbers indicative of addresses at which the character data items are stored.

When a pattern name address is generated by the pattern name address generator 3 based on the output from the display coordinate generator 2, the SDRAM 1 is accessed by the address via a memory interface device 5, to read out pattern name data. The pattern name data read out is once stored in a buffer, not shown. Then, based on the pattern name data stored in the buffer, a character data address is generated by the character data address generator 4, and the SDRAM 1 is accessed via the interface device 5 by this address to read out character data. Details of the pattern name address generator 3 and the character data address generator 4 will be described hereinafter.

The character data read out from the SDRAM 1 is sent via the memory interface device 5 to a dot data controller 6, which temporarily holds the character data for each screen to convert each dot of the character data into an RGB signal according to display scan and send the resulting RGB signals to the display device. Dot data to be actually displayed are determined according to priorities given to screens. The priorities can be determined in various ways. For example, priority numbers are assigned to respective pattern names, and display is sequentially effected of images on screens given larger priority numbers. In the case of transparent codes, according to which dot data for an image of a screen given a higher priority are set, dot data for an image of a screen given the next lower priority are displayed.

To control the pattern name address generator 3 and the character data address generator 4 to thereby set the display mode, i.e. the access mode (data readout mode), for each memory access slot for the SDRAM 1, sixteen mode-setting registers 7 are provided in the present embodiment. More specifically, to set the display mode for each unit of 8 dots (period of 8 access slots), there are provided (8 dots×2 banks=) 16 registers 7. A predetermined code for each memory access slot is set in each of these registers 7 according to details of the access. FIG. 5 shows an example of access slot control codes set in one of the registers 7.

To select the access slot control codes set in the mode-setting registers 7, there is provided a slot-selecting device 8. The slot-selecting device 8 is comprised of a 3-bit counter 8*a* for counting a 8-dot period, and a selector 8*b* for selecting one of the codes set in the registers 7, according to the count of the 3-bit counter 8*a*.

The code delivered from the slot-selecting device 8 is decoded by a decoder 9, into a signal for actually controlling the pattern name address generator 3 and the character data address generator 4. The output from the decoder 9 is delayed by a delay device 10 depending on processing required. More specifically, the decoded control code or signal is sent to the memory interface device 5 after it is delayed by a delay circuit 10*a* by a time period $\tau 1$ which is required to generate a pattern name address, and then the output from the pattern name address generator 3 instructs execution of access to the pattern name address of the SDRAM 1. The decoded control code is further delayed by a delay circuit 10*b* by a time period $\tau 2$ required for access to a character data address and the delayed control code is sent to the character data address generator 4 for control of generation of the character data address. Further, the decoded control code is delayed by a delay circuit 10*c* by a time period $\tau 3$ required to generate the character data address and the delayed control code is sent to the interface device 5, whereby the output from the character data address generator 4 instructs execution of access to the character data address of the SDRAM 1.

The decoder 9 provided at a stage before the delay device 10 in the FIG. 1 system may be replaced by decoders incorporated within the pattern name address generator 3 and the character data address generator 4.

The pattern name address generator 3 generates a pattern name address based on X-Y coordinates delivered from the display coordinate generator 2. At this time, attribute data (e.g. an offset value, etc.) for one of pattern name addresses set for each screen are selected according to the slot control code sent from the delay device 10. For example, when a code 0 is received, as shown in FIG. 5, a pattern name address is generated based on the attribute data of a first screen and values of the X-Y coordinates.

The character data address generator 4 generates a character data address based on a pattern name read out from the table of pattern name data within the SDRAM 1 and held in the buffer, and values of the X-Y coordinates delivered from the display coordinate generator 2. The pattern names held in the buffer are selected according to the display screen when the control code sent from the delay device 10 instructs access to character data. For example, when a code 4 appearing in FIG. 5 is received, a character data address is formed by adding a pattern name to the X-Y coordinates on the first screen.

The memory interface device 5 selects a pattern name address delivered from the pattern name address generator 3 when the slot control code sent from the delay device 10 instructs access to the pattern name address. The interface device 5 then delivers memory command signals, such as a memory address, RAS, and CAS to the SDRAM 1 according to the access timing to the SDRAM 1. The interface device 5 receives the resulting data or pattern name read out from the SDRAM 1 and delivers the pattern name to the character data address generator 4.

Further, the memory interface device 5 selects a character data address delivered from the character data address generator 4 when the slot control code sent from the delay device 10 instructs access to the character data address. The interface device 5 then delivers, memory command signals, such as a memory address, RAS, and CAS to the SDRAM 1 according to the access timing to the SDRAM 1. The interface device 5 receives the resulting character data read out from the SDRAM 1 and delivers the character data to the dot data control device 6.

FIG. 6 shows an example of access to the SDRAM 1 for reading out data therefrom by the use of the code setting shown in FIG. 5. In this example, the slot-selecting device 8 for the bank 0 delivers codes set in the register 7, in the order of 0, F, F, F, 4, 4, 4, and 4, over eight time slot periods T0 to T7. According to the example of setting, the first screen is set to 16 bits/dot for the number of display colors, and during a display time period (T0 to T7) for displaying 8 dots of data, pattern name data are read out from the bank 0 once (at T0), and character data are read out from the same [(16 bits/dot)×8 dots/32 bits=] four times (at T4 to T7).

Further, a second screen is set to 8 bits/dot, and third and fourth screens are both set to 4 bits/dot, for the number of display colors. Over the display time period (T0 to T7), pattern name data are read out from the bank 1 once (at T0) and character data are read out from the same [(8 bits/dot)×8 dots/32 bits=] two times (at T1, T2), for the second screen. For the third and fourth screens, pattern name data are read out once for each (at T4, T6), and character data are read out [(4 bits/dot)×8 dots/32 bits=] one time (at T5, T7).

In the above example, description has been made of display data for the character mode. When display data for the bit map mode are to be obtained, the pattern name address generator 3 appearing in FIG. 1 is not used, and the character data address generator 4 is replaced by a bit map data address generator.

Figures 7, 7A:
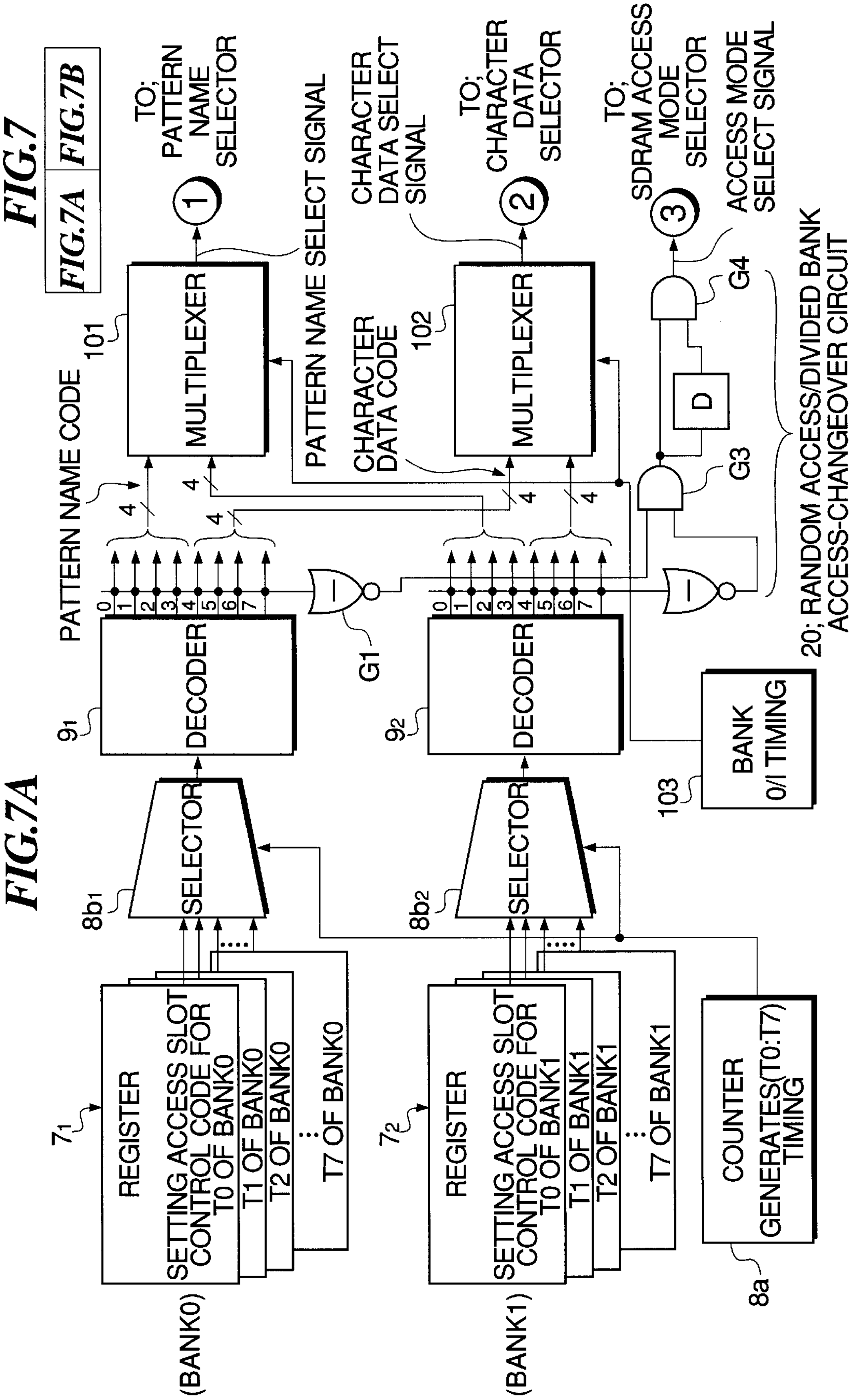
FIGS. 7A and 7B are circuit diagrams showing the arrangement of a random access/divided bank access-changeover circuit and component parts or circuits associated therewith employed in an image display control system according to a second embodiment of the invention.
Figure 7B:
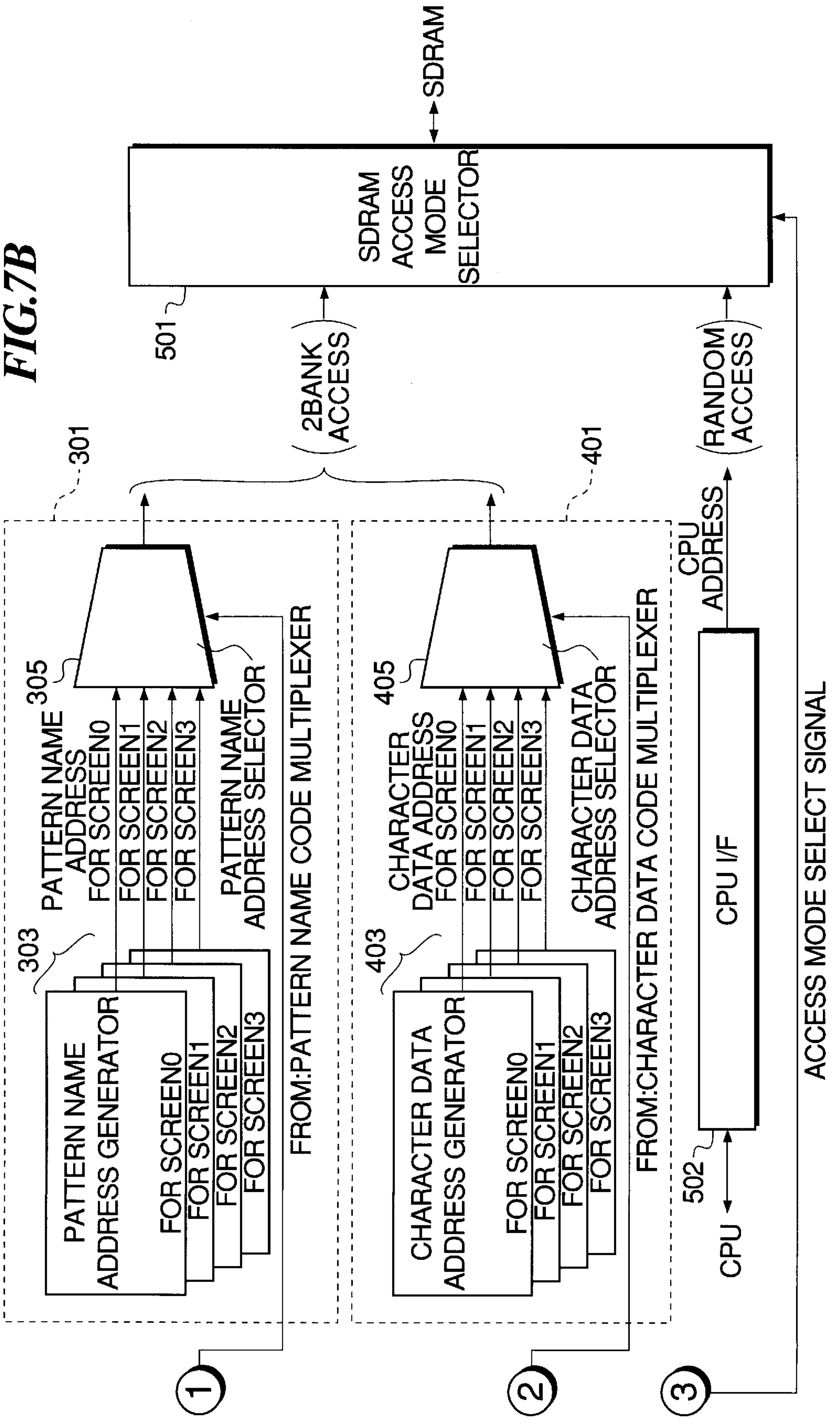

Next, reference is made to FIGS. 7 and 7B which show a second embodiment of the system which is arranged such that a CPU or a like circuit can interrupt the SDRAM 1 for random access to rewrite the display image, etc. The SDRAM 1 can operate in random access mode as well as in divided bank mode, as is usual with an ordinary DRAM. The present embodiment is intended to overcome the disadvantage with the prior art that although it is easy to completely separate the display period and the non-display period from each other and execute the random access during the non-display period, this manner of mode control can often have an insufficient number of unoccupied slots for responding to requests from the CPU, which results in a decrease in the processing speed of the system.

FIGS. 7A and 7B show the configuration of a control circuit section which outputs an access mode select signal including a random access mode select signal which permits interrupt access to a CPU when a free time slot is formed during the time period of display operation in the divided bank mode of the system. More specifically, if two contiguous slots are vacant or unoccupied at the banks 0, 1, a random access mode select signal is delivered. In these figures, component parts and elements which are similar construction to those described with reference to FIG. 1 are represented by identical reference numerals, and detailed description thereof is omitted.

It should be noted that FIGS. 7A and 7B illustrate circuits related to the supply of addresses to the SDRAM 1., and the remainder of the circuitry irrelevant thereto is omitted.

Referring first to FIG. 7A, reference numerals 71, 72 show mode-setting registers which correspond to the register 7 appearing in FIG. 1. These mode-setting registers 71, 72 each store a code selected from the ten access slot control codes shown in FIG. 10.

The access slot control codes delivered from the mode-setting registers 71, 72 are supplied to selectors 8*b*1, 8*b*2 corresponding to the selector 8*b* appearing in FIG. 1. These selectors 8*b*1, 8*b*2 sequentially select and deliver access slot controls codes input thereto, according to the count (T0 to T7) generated by the counter 8*a*. The access slot control codes delivered from the selectors 8*b*1, 8*b*2 are supplied to decoders 91, 92 which correspond to the decoder 9 in FIG. 1. The decoders 91, 92 decode the control codes supplied, and deliver signals instructing access to pattern names to a multiplexer 101 as pattern name codes and signals instructing access to character data to a multiplexer 102 as character data codes.

The multiplexers 101 and 102 responsive to a bank timing signal which is generated from a bank timing generator 103, alternately assuming a value of 0 and a value of 1, synthesize a pattern name code and a character data code supplied from the decoders 91, 92, and deliver the resulting signals as a pattern name select signal and a character data select signal, respectively. The pattern name select signal and the character data select signal are supplied to a pattern name address selector 305 and a character data address selector 405 both appearing in FIG. 7B, respectively.

Now, reference is made to FIG. 7B. In the figure, reference numerals 301 and 401 designate a pattern name address generator and a character data address generator corresponding to the pattern name address generator 3 and the character data address generator 4 in FIG. 1, respectively. These address generators 301, 401 each contain four address generators 303, 403 for four screens. In the pattern name address generator 301, each generator 303 generates a pattern name address based on X-Y coordinates supplied from the display coordinate generator 2, as described hereinabove, and delivers the pattern name address to a pattern name address selector 305. In the character data address generator 401, each generator 403 generates a character data address based on a pattern name read from the SDRAM 1 and X-Y coordinates supplied from the display coordinate generator 2, as described hereinabove, and delivers the character data address to a character data address selector 405. The pattern name address selector 305 and the character data address selector 405 select and deliver predetermined addresses according to the select signals supplied from the multiplexers 101, 102, respectively. At this time, the data selected by the selectors 305, 405 are supplied to an SDRAM access mode selector 501 provided at a later stage, in an alternating manner in the 2-bank mode (divided bank mode), according to changeover by the bank timing generator 103.

The SDRAM access mode selector 501 is also supplied with an address signal for use in the random access mode, from the CPU via a CPU interface 502. The SDRAM access mode selector 501 selects one of an address for use in the 2-bank (divided bank) mode supplied from the pattern name address generator 301 or the character data address generator 401 and an address for use in the random access mode supplied from the CPU interface 502, according to an access mode select signal, and executes access to the SDRAM by the selected address.

Now, the access mode select signal will be described. Referring to FIG. 7A, the two decoders 91, 92 are also connected to NOR gates G1, G2 to monitor the outputs from the mode-setting registers 71, 72 in the divided bank mode. These NOR gates G1, G2 determine whether or not control codes have been delivered, which instruct that no access to the banks 0, 1 is to be carried out. The logical product of the outputs from the NOR gates G1, G2 is obtained by an AND gate G3. Further, the output from the AND gate G3 is input to one terminal of an AND gate G4, and further via a delay element D, which delays the output by a time period of one slot, to the other input terminal of the AND gate G4. These gates G1 to G4 and the delay element D cooperate to form a random access/divided bank access-changeover circuit 20, which delivers the output from the AND gate G4 as the random access mode select signal to the CPU.

Figure 9:
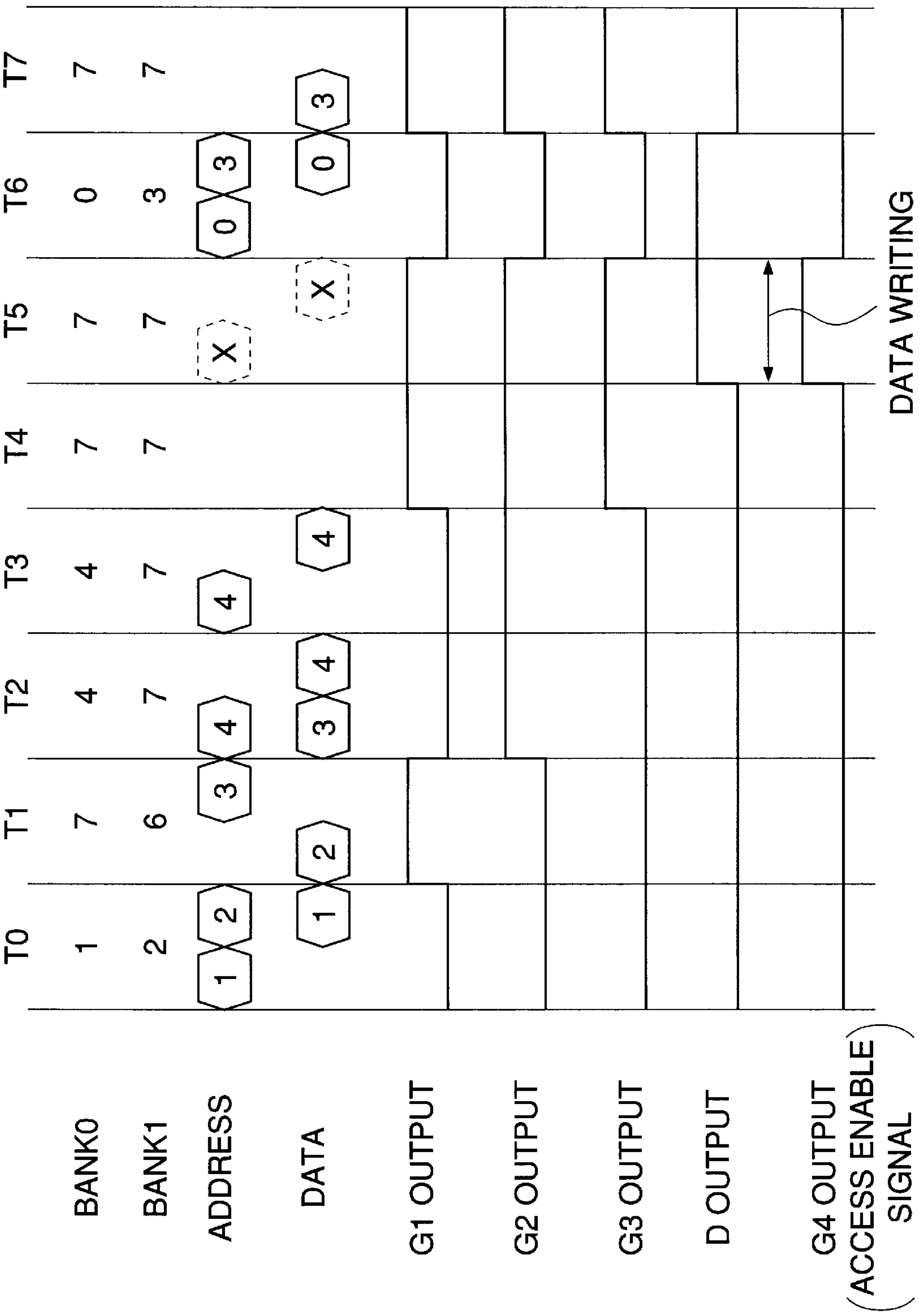
FIG. 9 is a timing chart showing timing of generation of a random access mode select signal by the random access/divided bank access-changeover circuit of the second embodiment.

For example, let it be assumed that access slot control codes set in the register 7 define contents of access shown in FIG. 8. FIG. 9 shows how the random access mode select signal is generated during operation of the system in the divided bank mode when the display mode is set by these control codes. At a slot where all the outputs from the decoders 91, 92 are "0" with the control code being set to 7 (no access is to be made), the outputs from the NOR gates G1, G2 are "1". The logical product of these output values is obtained by the AND gate G3 to give an output of "1" at slots T4, T5, T7 which are vacant for both the banks 0, 1. The AND gate G4 delivers as the random access mode select signal the logical product of the above output of "1" and a signal obtained by delaying the same by the time period of one slot, which assumes "1" at the slot T5.

In this way, when two contiguous slots, i.e. T4, T5 in the illustrated example are not used for access to the banks 0, 1 for display, the random access mode select signal is generated, which permits interrupt by the CPU. This makes it possible to write data into the SDRAM 1, by inputting the data and an address therefor at the access slot T5, as indicated by broken lines in FIG. 9.

As described above, the present embodiment makes it possible to open an access slot which is not used during a display period in the divided bank mode. As a result, the number of slots which the CPU can use increases, which makes it possible to operate the whole system at a still higher processing speed even in the case where the display image has to be rewritten frequently.

What is claimed is:

1. An image display control system comprising:

a memory that stores display data;

a display coordinate generator that generates coordinates on a display space, based on a count for use in a position scan;

an address generator that generates addresses of the display data stored in the memory, based on the coordinates generated by the display coordinate generator;

a memory interface device that accesses the memory according to the addresses generated by the address generator;

mode setting registers that set a display mode selected from a plurality of display modes for each memory access slot which represents a minimum unit time required for accessing one address of the memory;

a slot-selecting device that selects a set value from set values stored in the mode-setting registers to indicate the display mode;

a decoder that decodes the set value selected by the slot-selecting device to generate a control signal corresponding to the set display mode to be supplied to the address generator and the memory interface device; and a delay device that delays the control signal generated by the decoder by a time period required by the address generator for generating each of the addresses generated by the address generator.

2. An image display control system according to claim 1, wherein the memory has a table in which character data are stored, a table indicative of character data stored, and a table indicative of a relationship between positions on the display space and the character data, in which pattern name data items peculiar to respective items of the character data are stored, and wherein the address generator includes:

a character address generator that generates addresses of the character data stored in the memory, and a pattern name address generator that generates addresses of the pattern name data stored in the memory; and wherein the delay device has delay circuits that delays the control signal generated by the decoder by respective required time periods to supply the delayed control signal to the character addresses generator, the pattern name address generator, and the memory interface device.

3. A memory control system comprising;

a dynamic RAM that permits changeover between a divided bank mode in which an interior of the dynamic RAM is divided into at least two banks which are precharged separately for being addressed alternatively in a continuous manner, and a random access mode;

a mode-setting device that periodically sets a data readout mode in the divided bank mode of the dynamic RAM for each predetermined number of access slots;

an address generator that generates address for accessing the dynamic RAM according to the data readout mode set by the mode-setting device; and an interrupt control device that monitors outputs from the mode-setting device, and delivers an interrupt signal for changing a mode of access to the dynamic RAM from the divided bank mode to the random access mode when a contiguous occurrence of a predetermined number of access slots during which neither of the two banks are accessed is detected.

4. A memory control system according to claim 3, wherein the mode-setting device includes:

registers that each set an access mode for each access slot which represents a minimum unit time required for accessing one addresses of the dynamic RAM;

a slot-selecting device that selects a value indicative of the access mode which is set in each of the registers; and a decoder that decodes the value selected by the slot-selecting device to generate a control signal to be supplied to the address generator.

* * * * *